United States Patent [19]

Hayashi et al.

[11] Patent Number: 4,811,070
[45] Date of Patent: Mar. 7, 1989

[54] HETEROJUNCTION BIPOLAR TRANSISTOR WITH INVERSION LAYER BASE

[75] Inventors: Yutaka Hayashi; Kazuhiko Matsumoto; Nobuo Hashizume, all of Ibaraki, Japan

[73] Assignees: Agency of Industrial Science & Technology; Ministry of Internationl Trade & Industry, both of Tokyo, Japan

[21] Appl. No.: 30,747

[22] Filed: Mar. 27, 1987

[30] Foreign Application Priority Data

Mar. 27, 1986 [JP] Japan .................................. 61-69634

[51] Int. Cl.⁴ ........................................... H01L 29/72
[52] U.S. Cl. ....................................... 357/34; 357/16; 357/15; 357/59
[58] Field of Search .............. 357/34, 16, 59 H, 22 A, 357/22 MD, 34 HB, 15

[56] References Cited

U.S. PATENT DOCUMENTS

| | | | |
|---|---|---|---|
| 4,127,861 | 11/1978 | Deneuville | 357/59 BX |
| 4,380,774 | 4/1983 | Yoder | 357/34 |
| 4,670,767 | 6/1987 | Ohta | 357/16 X |
| 4,686,550 | 8/1987 | Capasso et al. | 357/16 |
| 4,691,215 | 9/1987 | Luryi | 357/34 X |

FOREIGN PATENT DOCUMENTS

| | | | |
|---|---|---|---|
| 0177246 | 4/1986 | European Pat. Off. | 357/16 X |
| 59-227161 | 12/1984 | Japan | 357/34 X |
| 61-292365 | 12/1986 | Japan | 357/34 HB |

OTHER PUBLICATIONS

Hayashi et al., "MIS Tunnel Emiher Transistor", *Extended Abstracts* (*The 45th Autumn Meeting,* 1984), The Japan Society of Applied Physics, Oct. 12, 1984, p. 6.407.
"Heterojunction Emitter Multiplies Transistors Current Gains by 50," *Electronics,* Oct. 25, 1979, p. 6.68.
"Heterojunction FET", *IBM Technical Disclosure Bulletin*, vol. 29, No. 1, Jun. 1986, pp. 471-472.

*Primary Examiner*—Martin H. Edlow
*Assistant Examiner*—William A. Mintel
*Attorney, Agent, or Firm*—Oblon, Fisher, Spivak, McClelland & Maier

[57] ABSTRACT

A semiconductor device comprises a first semiconductor region having formed thereon a second semiconductor region which forms at its one surface an energy barrier with respect to minority carriers of the first semiconductor region, a conductive region in contact with the other surface of the second semiconductor region, and an induced layer formed in the operating state in a surface portion of the first semiconductor region in contact with the second semiconductor region under the conductive region, the carriers being transported across the induced layer to the first semiconductor region, whereby the conductive region acts as an emitter, the induced layer acts as a base and the first semiconductor layer acts as a collector of a transistor.

17 Claims, 4 Drawing Sheets

HETEROJUNCTION BIPOLAR TRANSISTOR WITH INVERSION LAYER BASE

BACKGROUND OF THE INVENTION

This invention relates to a semiconductor device wherein a depletion or inversion layer induced in the surface portion of a semiconductor acts as the base of a transistor.

A transistor in which an inversion layer acts as a base was announced in Lecture No. 14P-A-3 at the 45th Science Lecture Meeting of the Applied Physics Society, Japan, Oct. 12, 1984. The structure of this earlier device is shown in FIG. 1 from which it will be noted that a first semiconductor region 1 is formed in its surface portion with an $SiO_2$ insulation film 2 of a thickness permitting tunneling (20–60A) and a metallic electrode 3 is formed on the insulation film 2. Application of a bias to the metallic electrode 3 induces an inversion layer 4 which serves as the base.

In this conventional transistor, a base contact region 5 formed of a p-type semiconductor is provided as joined with the inversion layer 4 acting as the base and the potential of the inversion layer 4 is controlled by applying control voltage to the contact region 5, whereby the current flowing between the metallic electrode 3 and the first semiconductor region 1 can be controlled. More specifically, the device operates as a transistor in which the metallic electrode 3 acts as the emitter, the first semiconductor region 1, which is of n-type, as the collector and the inversion layer 4, which is in electrical contact with the p-type base contact region 5, as the base. Thus, the injection of carriers from the emitter into the base region relies on the Fowler-Nordheim tunnel effect in the $SiO_2$ forming the insulation layer. That is to say, it makes use of the tunnel effect wherein the carriers are transported through the forbidden band. As a result, the operating current density becomes low. Therefore, while the device can be effectively applied for unit gates, cells and the like in LSIs, it is inappropriate for applications in which a load of large capacity has to be charged rapidly and thus has no potential for use in high-speed devices. Moreover, it is an unstable device in the sense that it is susceptible to operational fluctuations over time. A prior art heteroemitter bipolar transistor is disclosed in Japanese Patent Application Public Disclosure No. SHO 59-227161. Further, in the conventional hetero-emitter bipolar transistors a base region containing impurities at a high concentration is formed on the upper surface or in the surface portion of the first semiconductor region and an emitter containing impurities at a high concentration is then formed on the base region by hetero-epitaxial growth. However, in such an arrangement, since there is a limit on the temperature usable in the heat treatment carried out for preventing increase in base width, the productivity and operational efficiency are low. There is also the disadvantage that the process of epitaxially growing the emitter region on a base region having a high impurity concentration is apt to give rise to lattice defects, whereby the performance of the device is degraded and the production yield becomes low.

SUMMARY OF THE INVENTION

One object of the invention is to provide a semiconductor device in which a depletion or inversion layer induced on the surface of a semiconductor acts as the base of a transistor, wherein the operating current density and transconductance are large, the operating speed is fast even under large load, and the operation is stable over time.

Another object of the invention is to provide a semiconductor device which can be produced using heteroepitaxial growth techniques, enables the number of lattice defects produced during growth of the second semiconductor region to be minimized, and is amenable to easy production.

Still another object of the invention is to provide a high-performance semiconductor device capable of operating in the same manner as a bipolar transistor even when produced using an amorphous semiconductor.

For realizing these objects, the present invention provides a semiconductor device comprising a first semiconductor region, a second semiconductor region which contacts as its one surface the first semiconductor region and forms an energy barrier with respect to minority carriers of the first semiconductor region, a conductive region in contact with the other surface of the second semiconductor region, and a depletion or inversion layer (hereinafter, referred to as induced layer) formed in the operating state in a surface portion of the first semiconductor region in contact with the second semiconductor region under the conductive region. With this structure, the carriers supplied from the conductive region and transported through a conduction band or valence band of the second semiconductor region reach the first semiconductor region through the induced layer to cause the conductive region to act as an emitter, the induced layer to act as a base and the first semiconductor layer to act as a collector of a transistor.

In the device of this structure, when a prescribed bias is applied between the first semiconductor region and the conductive region, a induced layer is formed at the boundary portion of the first semiconductor region with respect to the second semiconductor region. Therefore, if a contact region making a rectifier junction with the first semiconductor region is provided close enough to the depletion or inversion layer to enable minority carrier to reach them from the depletion or induced layer, it becomes possible to control the number of electrons injected into the first semiconductor region by applying control voltage to the contact region so as to control the potential of the induced layer.

As no high-impurity concentration region is present at the boundary portion of the first semiconductor region in contact with the second semiconductor region, carrier mobility at the boundary portion is large and a high-speed device with low base resistance is realized. Moreover, as the device can be used with the induced layer connected with the two-dimensional gas channel of a field-effect transistor, it can be integrated on the same chip together with field-effect transistors to obtain a high-performance integrated circuit.

Further objects and features of the invention will be clear from a reading of the following detailed explanation in conjunction with the attached drawings.

DETAILED DESCRIPTION OF THE PREFERRED EMBODIMENTS

Figure 1:
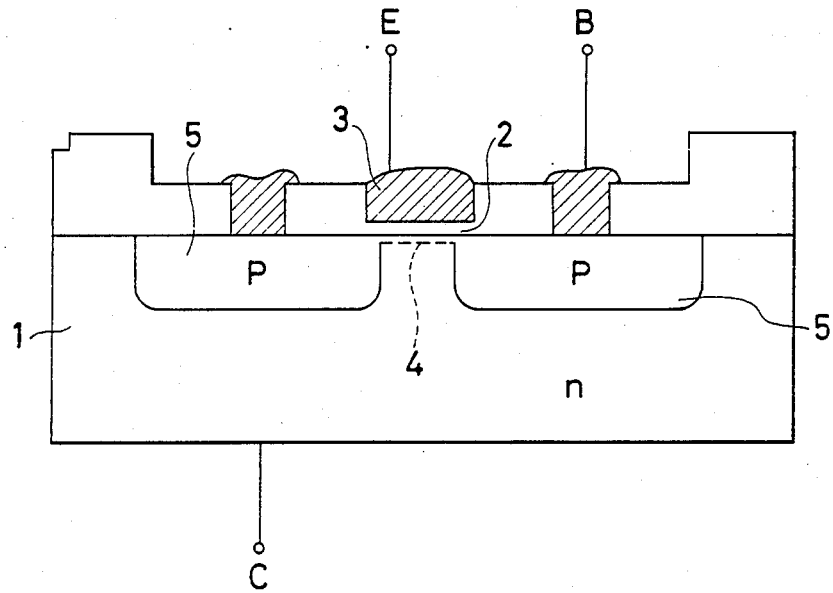
FIG. 1 is a schematic view of the structure of a conventional transistor using an inversion layer as the base.

A first embodiment of the semiconductor device according to the present invention will now be described with reference to FIG. 2.

The semiconductor device comprises a first semiconductor region 10 of a first conductivity type, which in the illustrated embodiment is constituted of an n-type semiconductor, namely of a high electron-density $n^+$-substrate 11 (of, for example, GaAs) and a low carrier density $n^-$-semiconductor layer 12 (of, for example, GaAs) grown on the surface of the $n^+$-substrate 11. The reference numeral 13 denotes an electrode consisting of a thin metallic film or the like formed on the bottom surface of the first semiconductor region 10.

The reference numeral 20 denotes a second semiconductor region formed on the surface of the first semiconductor region 10. In the case where the first semiconductor region 10 is formed of GaAs as in the illustrated embodiment, the second semiconductor region 20 is formed of AlAs semiconductor and is not doped with impurities. The second semiconductor region 20 can be generally described as a semiconductor region which has a wide bandgap of low carrier density and which forms an energy barrier with respect to minority carriers of the first semiconductor region 10.

The reference numeral 30 denotes a conductive region formed of, for example, high electron-density $n^+$-GaAs semiconductor and reference numeral 31 denotes metallic film formed on the upper surface of the conductive region 30.

The reference numeral 40 denotes a induced layer induced in the boundary portion of the first semiconductor region 10 with respect to the second semiconductor region 20 in the operating state of the device when a bias is applied to the conductive region 30.

The reference numeral 50 denotes a contact region formed on or in the peripheral portion of the induced layer 40. The only condition that need be met in the provision of the contact region 50 is that they be situated close enough to the induced layer 40 to permit minority carriers from the induced layer 40 to reach them. In the illustrated embodiment they are formed in self-aligned relation to the conductive region 30. As a result, electrical contact is secured between the contact region 50 and the induced layer 40 formed in the surface portion of the first semiconductor region 10 directly under the conductive region 30. Further, as the contact region 50 is formed a p-type ($p^+$ - GaAs) regions by selective ion-implantation of Mg or the like in the first semiconductor region 10, they maintain good rectification characteristics with respect to the first semiconductor region 10. In other words, the contact region 50 is formed downward from the surface of the first semiconductor region 10 at positions immediately outwardly adjacent to the region of the semiconductor 10 directly under the conductive region 30 and is thus electrically connected with the induced layer 40.

The reference numeral 51 denotes an electrode formed on the contact region by depositing a metal or the like on the exposed surface of the contact region 50 in such manner as to make electrical contact with the contact region 50. This arrangement makes it possible, for example, to control the potential of the induced layer 40 by applying a control voltage to the electrode 51.

While in the illustrated arrangement the contact region 50 is formed within the interior of the first semiconductor region so as to make contact with the induced layer 40, it is alternatively possible to provide them as separated from the induced layer 40 by such a distance on the order of the diffusion length as permits minority carriers from the induced layer 40 through the first semiconductor region 10 to reach the contact region 50, or, insofar as the aforesaid conditions are met, to form them on the surface of the first semiconductor region 10.

For the semiconductor device just described to be able to carry out the intended operation it is necessary for it to meet certain electronic conditions that will now be explained with reference to the band diagram for the device shown in FIG. 3.

First, a significant number of carriers from the conductive region 30 have to be excited to the conduction band Ec or the valence band Ev of the second semiconductor region 20. Therefore, the difference in energy level $\Delta E_i$ between the Fermi level $E_{Fn3}$ of the conductive region 30 and the conduction band Ec of the second semiconductor region 20 (in the case where the excited carriers are electrons) or between the same and the valence band Ev (in the case where the excited carriers are holes) must be kept to not more than 20 KT. This amounts to 0.52 eV at room temperature and to 0.13 eV at 77° K. On the other hand, in order to obtain a carrier injection efficiency of 0.5 or more (a grounded-emitter amplification factor of 1 or more) it is preferable to set the height of the energy barrier $\Delta E_B$ that the second semiconductor region 20 forms with respect to the minority carriers at the boundary between the first semiconductor region 10 and the second semiconductor region 20 to a higher value than $\Delta E_i$. Moreover, the second semiconductor region 20 itself has a low carrier density and is formed of a semiconductor having a wider energy gap than the first semiconductor region 10. In the energy band diagram of FIG. 3, the solid lines show the flat band condition while the broken lines show the state in which the conductive region 30 is negatively biased with respect to the first semiconductor region 10 so that electrons from the conductive region 30 pass through the conduction band of the second semiconductor region 20 to be injected into the first semiconductor region 10. In the figure, $E_{Fn1}$ and $E_{Fp1}$ respectively represent the Fermi levels of the electrons and holes of the first semiconductor region 10, while $E_{Fn3}$ and $E'_{Fn3}$ represent the Fermi level of the conductive region 30 in the flat band condition and the negatively biased state, respectively.

Under the above defined conditions, application of the prescribed bias will cause the induced layer 40 to be formed at the boundary portion of the first semiconductor region 10 with respect to the second semiconductor region 20. As a result, the number of electrons injected into the first semiconductor region 10 can be controlled by applying a control voltage to the contact region 50 to thus control the potential of the induced layer 40.

The injection of electrons (in the case of the n-type first semiconductor region) into the first semiconductor region 10 can further be controlled by irradiating the neighborhood of the boundary between the first semiconductor region 10 and the second semiconductor region 20 with light. More specifically, such irradiation with light leads to the generation of minority carriers which accumulate in the induced layer 40 and cause a separation between the quasi-Fermi level $E_{Fp1}$ of the minority carriers and the Fermi level $E_{Fn1}$. As a result, it becomes possible to realize injection of a larger number of electrons for one and the same bias $(E_{Fn1}-E'_{Fn3})$ between the first semiconductor region 10 and the conductive region 30. Thus the semiconductor device according to the invention can be operated as a phototransistor. In such cases, the contact region 50 is not absolutely necessary.

It is possible to enhance the efficiency of carrier injection from the conductive region 30 to the first semiconductor region 10 by improving the energy band profile of the second semiconductor region 20. Specifically, this can be accomplished by making the energy barrier with respect to majority carriers (injected carriers) in the vicinity of the conductive region 30 smaller than the energy barrier which the second semiconductor region 20 forms with respect to the minority carriers of the first semiconductor region 10 in the vicinity thereof. For example, it suffices to design the second semiconductor region 20 to have a band profile such that the energy barrier between the conductive region 30 and the second semiconductor region 20 does not exceed several KT or is not formed at all.

The injection efficiency can be further improved by using an arrangement in which the energy gap of the second semiconductor region 20 increases going from the side of the conductive region 30 toward the side of the first semiconductor region 10.

Figure 4:
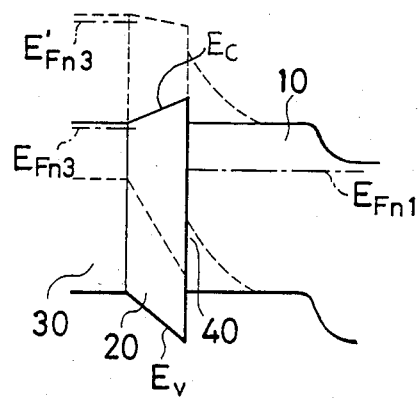
FIG. 4 is a band diagram for a semiconductor device according to a second embodiment of the invention.

The band diagram for a second embodiment of the semiconductor device meeting the aforesaid electronic conditions is shown in FIG. 4. In this figure, the elements indicated by like reference symbols with respect to those of the first embodiment have analogous structures and functions to those of the first embodiment and will not be described in detail again.

From FIG. 4 it will be noted that in the flat band condition, while the carriers (electrons) injected from the conductive region 30 are able to proceed to a considerable depth in the second semiconductor region 20, few of the carriers are yet able to pass through the energy barrier of the boundary between the first semiconductor region 10 and the second semiconductor region 20. Here the broken-like curves indicate the state where the bias has been increased to the point where the conduction band Ec of the second semiconductor region 20 becomes approximately horizontal. In this bias condition the carriers from the conductive region 30 are not stopped by the barrier but are injected into the first semiconductor region 10. Thus depending on the band profile of the second semiconductor region 20 it is possible to obtain a large current flow, making it possible to realize a high-speed device with a large transconductance gm. The arrangement shown in FIG. 4 can also of course be further provided with the contact region 50, whereby the current flowing between the first semiconductor region 10 and the ocnductive region 30 can be controlled by applying a bias between the contact region 50 and the conductive region 30. Such a second semiconductor region 20 can be obtained by using film-forming techniques to grow a thin film while varying the elemental ratios of a three- or four-element compound crystal or an amorphous semiconductor. While the foregoing embodiment was described as using a semiconductor with a high carrier density for the conductive region 30, it is alternatively possible to use a low resistance layer constituted of a metal or the like.

Figure 2:
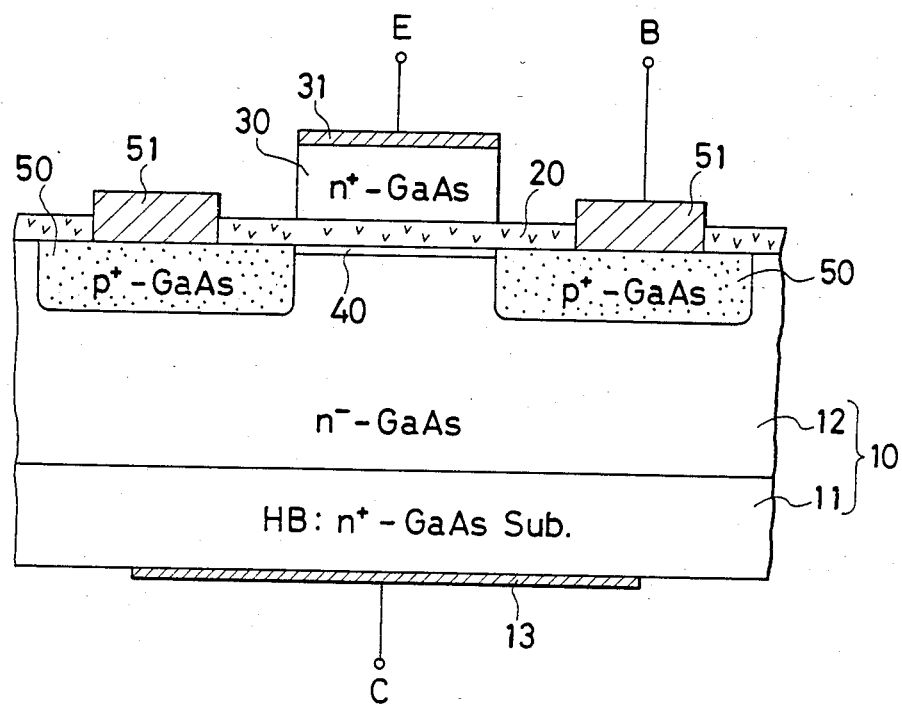
FIG. 2 is a schematic view of the structure of a semiconductor device according to a first embodiment of the invention.
Figure 3:
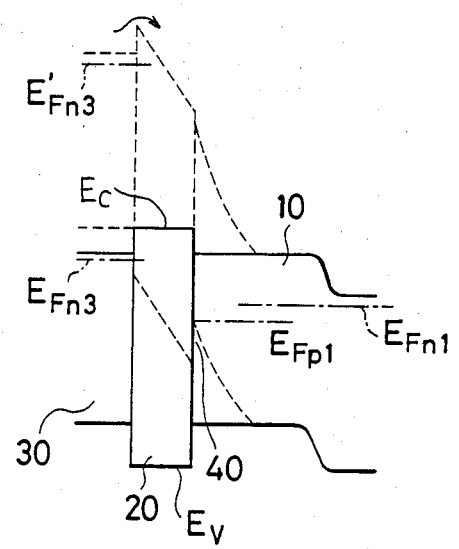
FIG. 3 is a band diagram for the semiconductor device shown in FIG. 2.
Figure 5:
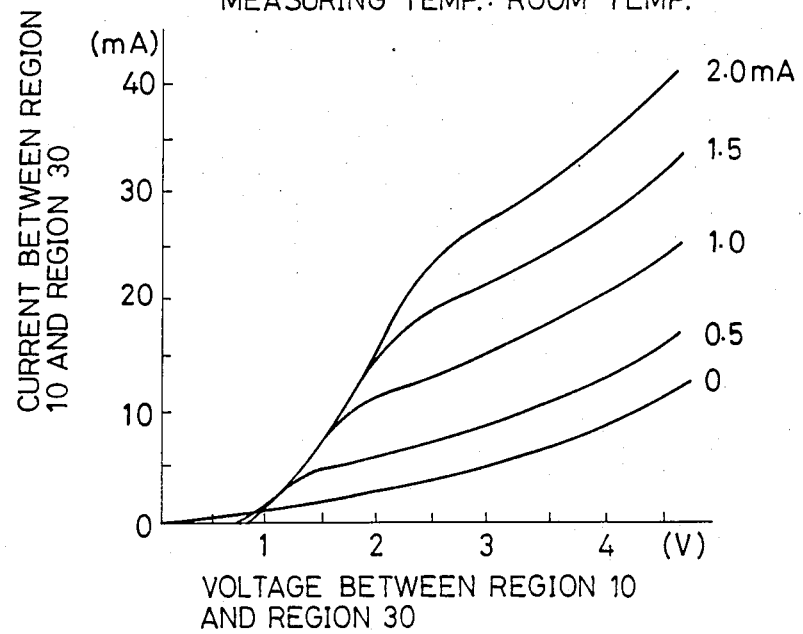
FIG. 5 is a graph showing the output characteristics of the semiconductor device of FIG. 2.

FIG. 5 shows the output characteristics of an actual semiconductor device fabricated in line with the structure shown in FIGS. 2 and 3 using GaAs-type crystal material. The semiconductor device had a high electron density n+-substrate 11, a low carrier density GaAs layer 12 grown to a thickness of 2.5 $\mu$m on the substrate 11, a second semiconductor region 20 formed of non-doped AlAs to a thickness of 0.04 $\mu$m, and a conductive region 30 formed of n+-GaAs to a thickness of 0.5 $\mu$m. The conductive region measured 50 $\mu$m by 50 $\mu$m in surface area. When the device was operated using the conductive region 30 as the emitter, the contact regions 50 as the base and the first semiconductor region 10 as the collector, the current amplification factor of the equivalent bipolar transistor was 16 at room temperature. In this device, the height of the energy barrier formed by the second semiconductor region 20 with respect to the inversion layer holes was $\Delta E_B=0.55$ eV, and the energy barrier with respect to the electrons was $\Delta E_i=0.2$ eV, which agrees with the theoretical relationship to obtain a reasonable current amplification factor.

Another embodiment of the invention exhibiting the band characteristics shown in FIG. 3 can be obtained by forming the first semiconductor region 10 of n-type $In_xGa_{1-x}As$ and the second semiconductor region 20 of InP.

Further, a semiconductor device exhibiting the band characteristics of FIG. 4 can be realized by forming the first semiconductor region 10 of n-type GaAs, forming the second semiconductor region 20 as a crystal layer obtained by growing a layer of $Al_xGa_{1-x}As$ in such manner that the value of x varies continuously from 1 to 0 with increasing distance from the surface of the first semiconductor region 10, and forming the conductive region 30 from n+-GaAs added with Si. In this case, while no barrier is present between the conductive region 30 and the second semiconductive region 20, an energy gap $\Delta E_B$ of 0.55 eV with respect to holes and of 0.2 eV with respect to electrons is formed between the first semiconductor region 10 and the second semiconductor region 20. With this arrangement, it is not absolutely necessary that there be a barrier with respect to the majority carriers (in this case electrons) between the first semiconductor region 10 and the second semiconductor region 20.

Such a structure graded in energy band brings about two desirable electronic effects. First, there can be easily formed a low or zero majority-carrier barrier between the conductive region 30 and the second semiconductor region 20 and a high minority-carrier (the induced layer carrier) barrier between the second semiconductor region 20 and the first semiconductor region 10. The combination of two energy barriers is desirable to obtain high current amplification factor. Second, the bias which is applied to the conductive region 30 to form an induced layer in the surface portion of the first semiconductor region is adapted to lower the potential barrier against the majority carriers from the conductive region 30 and also to accelerate the majority carriers injected from the conductive region 30 in the case that the bias voltage is large.

As one example of the invention, there was fabricated by a molecular beam epitaxial growing method a semiconductor device consisting of an n+-GaAs layer of a thickness of 5,000 A with carrier concentration of $1 \times 10^{18}$ cm$^{-3}$ as a conductive region, a double layer of an undoped, band-graded Al$_x$Ga$_{1-x}$As layer of a thickness of 150 A (varying from 0 at the boundary between itself and the conductive region to 0.4) and an undoped Al$_{0.4}$Ga$_{0.6}$As layer of a thickness of 300 A as a second semiconductor region, and an n$^-$-GaAs layer of a thickness of 1.5 μm with carrier concentration of $2 \times 10^{16}$ cm$^{-3}$ on an n$^+$-HB GaAs substrate as a first semiconductor region. A contact region 50 self-aligned with the conductive region 30 was formed in the surface portion of the first semiconductor region by ion-implantation of Mg. The device thus fabricated with the above-mentioned graded structure current gain of 40 at 77° K., while a device without a graded Al$_x$Ga$_{1-x}$As layer as noted above exhibited small current gain of 0.5 at 77° K. Thus, the graded bandgap structure in the second semiconductor region remarkably improves the current gain of the device of the invention.

When the first semiconductor region consists of n-type crystalline silicon with donor concentration of $10^{14}$ to $10^{17}$ atom/cm$^3$, an amorphous silicon layer of a thickness of 100 to 1,000A having low impurity density or no valency control impurity is deposited on the first semiconductor region of crystalline silicone by the well-known plasma- or photo-CVD method using mono-silane at 150° at 300° C. to form a second semiconductor region. The conductive region may be made of a Cr metal film or a phosphorous-doped n-type amorphous silicon-germanium film.

The graded-band structure in the second semiconductor region can be formed by using amorphous Si$_{1-x}$Ge$_x$:H with the value x varying from a large numer (e.g. x=0.5) at the boundary between the conductive region and the second semiconductor region to a small number (e.g. x=0) at the boundary between the first semiconductor region and the second semiconductor region. In this graded-band structure, a barrier height against electrons at the boundary between the conductive region and the second semiconductor region can be zero when the conductive region consists of amorphous Si$_{1-x}$Ge$_x$:H (e.g. x=0.5), and a barrier height against holes at the boundary between the second semiconductor region and the first semiconductor region is 0.4 eV to 0.7 eV, which is determined in accordance with the depositing condition of amorphous Si$_{1-x}$Ge$_x$:H. The amorphous Si$_{1-x}$Ge$_x$:H film is deposited by plasma- or photo-CVD method using hydrogen gas, mono-silane and germane gas. The graded-band structure can be obtained by changing the flow-rate ratio of germane to mono-silane deposition.

The contact region may be made as a p-type region in the surface portion of n-type silicon (the first semiconductor region). The semiconductor device according to the present invention can be also accomplished by adopting other amorphous layer structure, e.g. Cr or n-type amorphous silicon, non-doped amorphous silicon carbide, a double layer of non-doped amorphous silicone and n-type amorphous silicon, which are used as a conductive region, a second semiconductor region and a first semiconductor region, respectively.

These embodiments using amorphous films will establish new semiconductor technology capable of producing semiconductor devices at a low price.

As is clear from the foregoing description, in accordance with the arrangement of the semiconductor in accordance with the present invention, no high impurity concentration is present between the first semiconductor region and the second semiconductor region so that the boundary structure is the same as that in a HEMT or SIS field effect transistor. As a result, the carrier mobility at the boundary is large and it is possible to realize a high-speed device with a small base resistance. Moreover, the device can be used as connected with the two-dimensional gas channel of a field effect transistor, making it possible to obtain a high-performance integrated circuit by integrating the devices together with field effect transistors. Further, differently from the hetero-emitter bipolar transistor, no high impurity concentration layer is present in the vicinity of the boundary between the first semiconductor region and the second semiconductor region so that there is no restriction on or hindrance to the heat treatment carried out during the film growth process. Likewise in the case of carrying out fabrication by the use of hetero-epitaxial techniques no need arises to form a crystal layer of one type on a crystal layer of another type which contains a high impurity concentration so that crystal growth can be carried out without giving rise to lattice defects. High performance semiconductor devices can therefore be produced easily.

What is claimed is:

1. A bipolar semiconductor device comprising:
   a first semiconductor region of a first conductivity type;
   a second semiconductor region having two opposing surfaces and having between said two opposing surfaces a thickness sufficient to suppress carrier tunneling through said second semiconductor region and for majority carriers to be transported through a conduction band of said second semiconductor region which contacts at one of said two opposing surfaces the first semiconductor region, has a bandgap wider than that of the first semiconductor region and forms an energy barrier with respect to minority carriers of the first semiconductor region;
   a conductive region in contact with the other surface of the second semiconductor region at said other surface to form a barrier height less than 0.5 eV with respect to majority carriers of the first semiconductor region; and
   an electrically induced layer with conductivity type opposite to the first conductivity type formed in the operating state in a surface portion of the first semiconductor region in contact with the second semiconductor region on which the conductive region contacts,
   wherein carriers supplied from the conductive region and transported through a conduction band of the second semiconductor region reach the first semiconductor region across the electrically induced layer to cause the conductive region to act as an emitter, the electrically induced layer to act as a base and the first semiconductor region to act as a collector of a transistor.

2. A semiconductor device according to claim 1 wherein a contact region which makes a rectifier junction with the first semiconductor region on the surface of the first semiconductor region is further provided in electrical contact with the induced layer.

3. A semiconductor device according to claim 1 wherein the second semiconductor region forms an energy barrier with respect to majority carriers of the first semiconductor region between itself and the conductive region, which is smaller than an energy barrier formed with respect to minority carriers between the second and first semiconductor regions.

4. A semiconductor device according to claim 1 wherein at least part of the band gap of the second semiconductor region grows larger going from the conductive region toward the first semiconductor region.

5. A semiconductor device according to claim 2 wherein the first semiconductor region is formed of GaAs crystal, said second semiconductor region is formed of AlAs or $Al_xGa_{1-x}As$ crystal and the conductive region is formed of $n^+$-GaAs of high electron density, the conductive region and the contact region being in self-aligned state.

6. A semiconductor device according to claim 5 wherein the first semiconductor region is formed of an $n^+$-GaAs substrate of high electron density and an $n^-$-GaAs layer formed on the $n^+$-GaAs substrate.

7. A semiconductor device according to claim 5 wherein the contact region forms a rectifier junction with the first semiconductor region, makes electrical contact with the induced layer, and is formed by ion implantation as a $p^+$-GaAs layer within the first semiconductor region.

8. A semiconductor device according to claim 1 wherein the second semiconductor region has a graded-band structure which forms a majority-carrier barrier between itself and the first semiconductor region and forms between itself and the conductive region a lower majority-carrier barrier, said second semiconductor region having the graded-band structure being formed of an amorphous substance.

9. A semiconductor device according to claim 1 wherein a contact region which makes a rectifier junction with the first semiconductor region within the first semiconductor region is further provided in electrical contact with the induced layer.

10. A semiconductor device according to claim 1 wherein the second semiconductor region forms no energy barrier with respect to majority carriers of the first semiconductor region between itself and the conductive region.

11. A bipolar semiconductor device comprising:
a first semiconductor region of a first conductivity type;
a second semiconductor region having two opposing surfaces and having between said two opposing surfaces a thickness sufficient to suppress carrier tunneling through said second semiconductor region and for majority carriers to be transported through a valence band of said second semiconductor region which contacts at one of said two opposing surfaces the first semiconductor region; has a bandgap wider than that of the first semiconductor region and forms an energy barrier with respect to minority carriers of the first semiconductor region;
a conductive region in contact with the other surface of the second semiconductor region at said other surface to form a barrier height less than 0.5 eV with respect to majority carriers of the first semiconductor region; and
an electrically induced layer with conductivity type opposite to the first conductivity type formed in the operating state in a surface portion of the first semiconductor region in contact with the second semiconductor region on which the conductive region contacts,
wherein carriers supplied from the conductive region and transported through a valence band of the second semiconductor region reach the first semiconductor region across the electrically induced layer to cause the conductive region to act as an emitter, the electrically induced layer to act as a base and the first semiconductor region to act as a collector of a transistor.

12. A semiconductor device according to claim 11, wherein a contact region which makes a rectifier junction with the first semiconductor region on the surface of the first semiconductor region is further provided in electrical contact with the induced layer.

13. A semiconductor device according to claim 11, wherein the second semiconductor region forms an energy barrier with respect to majority carriers of the first semiconductor region between itself and the conductive region, which is smaller than an energy barrier formed with respect to minority carriers between the second and first semiconductor regions.

14. A semiconductor device according to claim 11, wherein at least a part of the band gap of the second semiconductor region grows larger going from the conductive region toward the first semiconductor region.

15. A semiconductor device according to claim 11, wherein the second semiconductor region has a graded-band structure which forms a majority-carrier barrier between itself and the first semiconductor region and forms between itself and the conductive region a lower majority-carrier barrier, said second semiconductive region having the graded-band structure being formed of an amorphous substance.

16. A semiconductor device according to claim 11, wherein a contact region which makes a rectifier junction with the first semiconductor region within the first semiconductor region is further provided in electrical contact with the induced layer.

17. A semiconductor device according to claim 11, wherein the second semiconductor region forms no energy barrier with respect to majority carriers of the first semiconductor region between itself and the conductive region.

* * * * *